United States Patent
Blattner et al.

(10) Patent No.: US 6,540,468 B1
(45) Date of Patent: Apr. 1, 2003

(54) DEVICE AND METHOD FOR HANDLING INDIVIDUAL WAFERS

(75) Inventors: Jakob Blattner, Ermatingen (CH); Reto Stibi, Altnau (CH)

(73) Assignee: Tec-Sem AG, Tägerwilen (CH)

(*) Notice: Subject to any disclaimer, the term of this patent is extended or adjusted under 35 U.S.C. 154(b) by 0 days.

(21) Appl. No.: 09/786,315

(22) PCT Filed: Aug. 30, 1999

(86) PCT No.: PCT/CH99/00400

§ 371 (c)(1),
(2), (4) Date: Apr. 17, 2001

(87) PCT Pub. No.: WO00/14772

PCT Pub. Date: Mar. 16, 2000

(30) Foreign Application Priority Data

Sep. 2, 1998 (CH) .............................................. 1791/98

(51) Int. Cl.[7] .......................... H01L 21/00; B65G 49/07
(52) U.S. Cl. .................................. 414/416.08; 414/941
(58) Field of Search .............................. 414/416.08, 941

(56) References Cited

U.S. PATENT DOCUMENTS 5,374,147 A    12/1994  Hiroki et al.
5,380,137 A    1/1995   Wada

FOREIGN PATENT DOCUMENTS

| EP | 0 858 866 | 8/1998 |
| WO | 94/19821 | * 9/1994 |
| WO | 97/45861 | 12/1997 |

* cited by examiner

*Primary Examiner*—Steven A. Bratlie
(74) *Attorney, Agent, or Firm*—Venable; Norman N. Kunitz

(57) ABSTRACT

An apparatus and a method for handling individual wafers (2) that are temporarily in an essentially horizontal position. The apparatus (1) comprises at least one supporting part (5) with supporting areas (6), comprising at least three supporting points (9), for supporting an edge region of the wafer, and at least one holding part (7) with holding areas (8), comprising at least two holding points (10), for gripping the edge (4) of this wafer (2), with the holding points (10) being moveable relative to the supporting points (9) and, to grasp the wafer (2), relative to one another. Moreover, at least one of these holding points (10) is arranged on a rotatable rod (12) designed, for reliable holding of the wafer, as a holding part (7), with rod (12) extending coaxially with an axis (11) running through the wafer center (3) and essentially parallel to the surface of the wafer (2).

12 Claims, 2 Drawing Sheets

DEVICE AND METHOD FOR HANDLING INDIVIDUAL WAFERS

BACKGROUND OF THE INVENTION

The invention relates to an apparatus and to a method for handling individual wafers that are at least temporarily in an essentially horizontal position and that have a centre and an edge, the apparatus comprising at least one supporting part with supporting areas for supporting a wafer in the edge region of the latter and at least one holding part with holding areas for gripping the edge of this wafer, with the supporting areas comprising at least three supporting points and the holding areas comprising at least two holding points, and with the at least two holding points being arranged in such a way that they can be moved relative to the supporting points and—to grasp the wafer—relative to one another.

Wafers, i.e. flat, essentially circular, monocrystalline silicon discs, which are used to produce semiconductor products, are handled in clean or ultraclean rooms that satisfy special requirements and are known per se. To eliminate or at least minimize contamination or soiling of the surfaces of the wafers, automated handling is moreover preferably employed for the wafers. After or between cleaning processes, for example, the wafers are sLacked in magazines. These magazines have standardized dimensions and can be stored and transported securely in cassettes or transport boxes. The wafers often rest by their edge region on two at least approximately horizontal rails of the magazines and thus form a vertical stack of wafers. To remove discs or wafers of this kind from such magazines, in which they occupy an essentially horizontal position, or to deposit them in these magazines, either the entire stack of wafers is moved or individual, possibly predesignated, wafers are removed from the magazine or inserted into it. Preferably, it should be possible, after removing a wafer from a magazine, to deposit it at any desired location.

The prior art includes apparatus for transporting individual wafers that has simple gripping apparatus. Such apparatus is only suitable for transporting essentially vertically aligned, upright wafers. The prior art includes further apparatus and robots that hold a wafer by means of a vacuum: e.g. U.S. Pat. No. 4,886,412 has disclosed a robot for handling essentially vertically aligned wafers, while WO 98/02906 has disclosed a robot for handling essentially horizontally aligned wafers. Each of these robots is thus essentially tied to one wafer alignment, and this can be a disadvantage because the applications of these robots are limited.

EP 0 365 589 has disclosed an apparatus of the generic type and a method of the generic type for handling individual silicon discs or wafers stored essentially horizontally in magazines: a device for transporting an individual silicon disc having moving wheel-shaped carriers that can be moved relative to one another between a closed position—in which a wafer can be carried exclusively through the contact between the circumference of the wafer and the carriers— and an open position—in which a wafer can be arranged between the carriers. To pick up a wafer, a respective support having at least two wheel-shaped carriers is moved from each of two opposite sides partially into a magazine filled with wafers until the edge region of the selected wafer touches the wheel-shaped carriers on their oblique supporting areas and on their cylindrically shaped holding areas (cf. FIG. 4). The wafer picked up and fixed in this way is transported out of the magazine by joint unilateral movement of the two supports. This apparatus and this method have the disadvantage that if a wafer has been moved out of the magazine one of the two supports extends through the magazine (being made longer for this purpose), with the result that it is not possible to move the wafer in a different direction to that for removal of the latter from the magazine without transferring the wafer to a further transfer robot, such as that disclosed in U.S. Pat. No. 4,923,054, the gripping mechanism (cf. FIG. 6) of which corresponds essentially to that in EP 0 365 589. However, because of its overall height the gripper described in U.S. Pat. No. 4,923,054 is not suitable for direct removal of a wafer lying between two immediately adjacent wafers from a filled magazine because it cannot be inserted between two wafers of a filled magazine.

Another disadvantage of the apparatus and the method described in EP 0 365 589 could be regarded as the fact that it is only possible to remove wafers from magazines or place them in the latter if these magazines have been removed beforehand from the cassette that protects them. If use is made of cassettes in which a transfer opening or door is opened on one side for the removal of a wafer, it is not possible to use this apparatus.

U.S. Pat. No. 4,923,054 has disclosed another apparatus for handling a wafer, which comprises a two-armed robot, the front arm of which comprises a support plate for supporting a wafer. However, this robot cannot perform vertical movement, and the magazine must therefore be lowered somewhat to enable the robot arm with the wafer resting on it to be removed smoothly from the support rails of the magazine. This distribution of the movements between two different devices requires a coordinating control system. Moreover, the wafer is touched approximately at its centre; although this naturally takes place on the rear side of the wafer, this is associated with a certain risk of contamination.

EP 0 858 866 discloses another apparatus of the generic type. This relates to a mechanical robot arm for transferring a wafer. A unilateral force is exerted on the wafer 35 by means of holding fingers 102, 104, pressing the wafer against a holding bridge 106 (cf. FIG. 3 and FIG. 5 with the holding fingers in the closed state and FIG. 7, where they are in the open state). EP 0 858 866 thus also discloses that the wafer performs a movement subject to friction. With the solution proposed there, it may be possible to reduce this friction, but it cannot be avoided.

U.S. Pat. No. 5,380,137 has disclosed another apparatus for heat-treating wafers. This apparatus comprises an arm for transferring a wafer between a wafer magazine ("boat 10", cf. FIG. 1), in which a multiplicity of wafer support plates ("support plates 11", cf. FIG. 2) are stacked vertically with regular gaps in between, and a cassette ("cassette 50", cf. FIG. 4), in which the wafers are likewise to be stacked vertically with regular gaps in between. A wafer-lifting mechanism ("push up mechanism 20, 21") and a carrying fork ("fork 31") co-operate. The carrying fork 31 has a recess 65 to ensure that, as it enters a stack, it does not collide with the carrying pin 22, which is situated on the axis of insertion and is connected to the lifting mechanism 21 (cf. FIG. 15). With this apparatus, wafers can only be transported in a horizontal position and stacked vertically.

Another apparatus of the generic type for handling individual flat glass substrates during the production of LCD displays and wafers is known from U.S. Pat. No. 5,374,147. The apparatus for transferring an LCD substrate in a vacuum comprises a first table, on which the LCD substrate is secured in such a way that its surface is aligned essentially horizontally. The substrate is placed on the table or on silicone rubber support elements that are preferably provided and is positioned by means of holding elements (which are immovable or can clamp the substrate between them). The apparatus disclosed allows substrates to be held and transported exclusively in a horizontal position.

SUMMARY OF THE INVENTION

The object of the present invention is to provide an apparatus and a method for handling wafers that make it possible to pick up individual essentially horizontal wafers, in particular wafers lying in a magazine, essentially without friction and to transport and deposit them in virtually any desired position.

According to a first aspect of the invention, this object is achieved by an apparatus for handling individual wafers that are at least temporarily in an essentially horizontal position and that have a centre and an edge, with the apparatus comprising: at least one supporting part with supporting areas for supporting a wafer in the edge region of the latter and at least one holding part with holding areas for gripping the edge of this wafer, with the supporting areas comprising at least three supporting points and the holding areas comprising at least two holding points, and with the at least two holding points being arranged such that they can be moved relative to the supporting points and, to grasp the wafer, relative to one another. At least one of these holding points is arranged on a rotatable rod designed, for reliable holding of the wafer, as a holding part, with this rotatable rod extending coaxially with an axis running through the centre of the wafer and essentially parallel to the surface of the wafer. Advantageous modifications and developments of the apparatus according to the invention are discussed.

According to a second aspect of the invention, this object is achieved by a method for handling individual wafers that are at least temporarily in an essentially horizontal position and that have a centre and an edge, using an apparatus that comprises at least one supporting part with supporting areas for supporting a wafer in the edge region of the latter and at least one holding part with holding areas for gripping the edge of this wafer, with the supporting areas comprising at least three supporting points and the holding areas comprising at least two holding points, and the at least two holding points being arranged such that they can be moved relative to the supporting points and, to grasp the wafer, relative to one another. According to the method, the wafer is raised by raising the supporting areas and held by moving the holding areas relative to the supporting areas and moving at least two holding points relative to one another; at least one of these holding points is arranged on a rotatable rod designed as a holding part that extends coaxially with an axis running through the centre of the wafer and essentially parallel to the surface of the wafer. Advantageous modifications and developments of the method according to the invention likewise are disclosed.

Preferred embodiments of the invention are illustrated more or less schematically as examples in the figures, but these examples are not in any way intended to restrict the scope of the present invention.

BRIEF DESCRIPTION OF THE DRAWINGS

FIG. 1 shows 3 supporting points and 3 holding points in accordance with a first embodiment;

FIG. 2 shows 3 supporting points and 4 holding points in accordance with a second embodiment;

FIG. 3 shows 4 supporting points and 2 holding points in accordance with a third embodiment;

FIG. 4 shows 4 supporting points and 4 holding points in accordance with a fourth embodiment;

FIG. 5 shows 3 supporting points and 4 holding points in accordance with a fifth embodiment;

FIG. 6 shows 4 supporting points and 3 holding points in accordance with a sixth embodiment;

DESCRIPTION OF THE PREFERRED EMBODIMENTS

Figure 1:
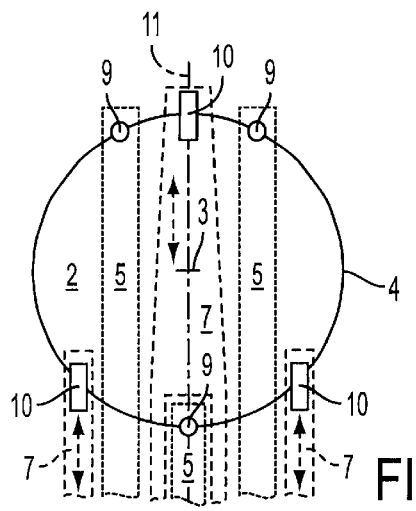
FIGS. 1 to 6 show schematic distribution patterns of supporting points and holding points.

FIGS. 1 to 6 show a wafer 2 with a centre 3 and an edge 4 plus an axis 11 running through the centre 3 of the wafer 2. Of an apparatus 1 for handling a wafer 2, the figures show in a highly schematized form supporting parts 5 with supporting areas 6 and holding parts 7 with holding areas 8, the supporting areas 6 comprising supporting points 9 (represented as circles) and the holding areas 8 comprising holding points 10 (represented as rectangles). Because the emphasis in these diagrams is primarily on the fundamental distribution of the supporting and holding points 9, 10, the supporting parts 5 and the holding parts 7 are shown only in broken lines; this is furthermore intended to illustrate that these are only proposals for embodiments of these supporting and holding parts 5, 7, not specific designs. While all the supporting parts 5 with the supporting areas 6 and supporting points 9 are arranged immovably relative to one another, the holding parts 7 with the holding areas 8 and the holding points 10 can be moved away from and towards one another and hence also relative to the supporting parts 5 with the supporting areas 6 and supporting points 9. These movements can take place in the direction of the double arrows that have been drawn in, for example, but rotary movements may also be provided. All the supporting points 9 and holding points 10 are situated in the region of the edge 4 of the wafer 2. This means that the wafer 4 rests on the supporting areas 6 essentially in the region of its edge and that holding areas 8 make contact with the wafer 2 essentially in the region of its edge.

FIG. 1 shows three supporting points 9 and three holding points 10 in accordance with a first embodiment of the invention. In this arrangement, one supporting point 9 and one holding point 10 lie at least essentially on the axis 11 running through the centre 3 of the wafer 2. The two other supporting points 9 and holding points 10 each lie on the right and left, i.e. on each side of the axis 11. The seeming impossibility of placing one supporting point 9 and one holding point 10 on the axis 11 is overcome by making the holding area 7 fork-shaped, for example; coaxially arranged tubes (not shown) that can be displaced relative to one another and telescoped are also suitable for this purpose, the outer tube comprising the supporting point 9 and the inner, displaceable, tube comprising the holding point 10.

Figure 2:
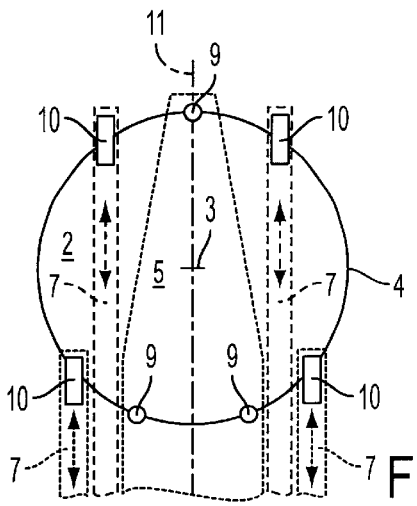

FIG. 2 shows three supporting points 9 and four holding points 10 in accordance with a second embodiment of the invention. In this arrangement, one supporting point 9 lies at least essentially on the axis 11 running through the centre 3 of the wafer 2. The other two supporting points 9 and all the holding points 10 lie on the right and left, i.e. on each side of the axis 11.

Figure 3:
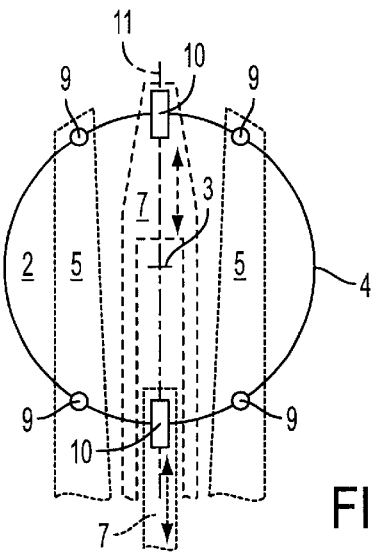

FIG. 3 shows four supporting points 9 and two holding points 10 in accordance with a third embodiment of the invention. In this arrangement, both of the holding points 10 but none of the supporting points 9 lie essentially on the axis 11 running through the centre 3 of the wafer 2. All the supporting points 9 lie either on the right or left, i.e. on each side of the axis 11. The seeming impossibility of placing two holding points 10 on the axis 11 is overcome by making one holding area 7 fork-shaped, for example; coaxially arranged tubes (not shown) that can be displaced relative to one another are also suitable for this purpose, the outer tube and the inner tube being of displaceable design and each comprising a holding point 10.

Figure 4:
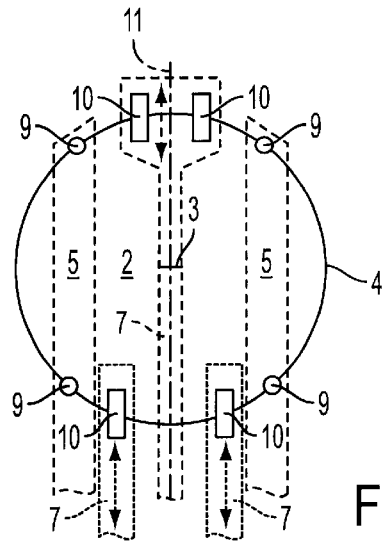

FIG. 4 shows four supporting points 9 and four holding points 10 in accordance with a fourth embodiment of the invention. In this arrangement, all the supporting points 9 and all the holding points 10 lie on the right and left, i.e. on each side of the axis 11. As an alternative to this illustration, the two holding points 10 that are situated on the same holding part 7 can be designed as a common holding point 10, leaving just three holding points. In this case, the common holding point 10 would preferably lie on the axis 11 passing through the centre 3 of the wafer 2.

Figure 5:
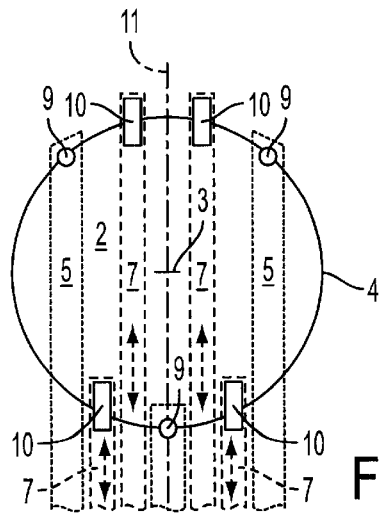

FIG. 5 shows three supporting points 9 and four holding points 10 in accordance with a fifth embodiment of the invention. In this arrangement, one supporting point 9 lies at least essentially on the axis 11 running through the centre 3 of the wafer 2. The two other supporting points 9 and all the holding points 10 lie on the right and left, i.e. on each side of the axis 11. As an alternative to this illustration, the two holding points 10 that are situated on the holding parts 7 closest to the axis 11 can be designed as a common holding point 10, leaving just three holding points. In this case, the common holding point 10 would preferably lie on the axis 11 passing through the centre 3 of the wafer 2. The seeming impossibility of placing one supporting point 9 and a common holding point 10 on the axis 11 can be overcome by making the common inner holding area 7 fork-shaped, for example; coaxially arranged tubes (not shown) that can be displaced relative to one another are also suitable for this purpose, the outer tube comprising the supporting point 9 and the inner, displaceable, tube comprising the holding point 10.

Figure 6:
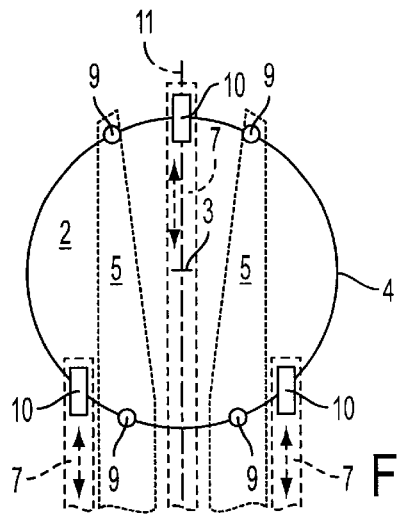

FIG. 6 shows four supporting points 9 and three holding points 10 in accordance with a sixth embodiment of the invention. In this arrangement, one holding point 10 lies essentially on the axis 11 running through the centre 3 of the wafer 2. All the supporting points 9 and all the other holding points 10 are arranged on the right and left, i.e. on each side of the axis 11.

Figure 7:
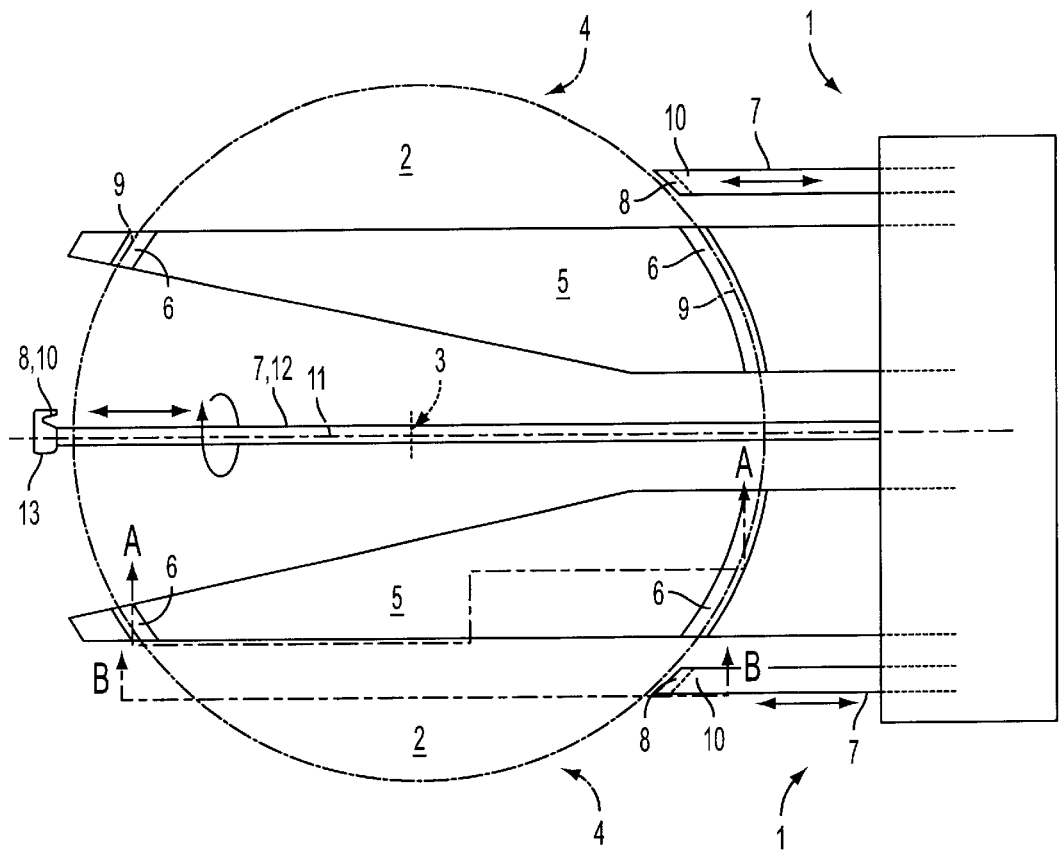
FIG. 7 shows a plan view of an apparatus according to the invention in accordance with a sixth embodiment in FIG. 6.

FIG. 7 shows a first variant of the sixth embodiment shown in FIG. 6. A holding part 7 in the form of a rotatable rod 12 with a head 13 is arranged coaxially with the axis 11 running through the centre 3 of the wafer 2. The rod 12 can be moved along the double arrow, moving the head 13 towards or away from the edge 4 of the wafer 2. On one side, the head 13 has a recess including the holding areas 8. To enable these holding areas 8 to be aligned in such a way that they just touch the edge 4 of the wafer 2 and hence hold the wafer 2, the rod 12 can be rotated in the direction of the arrow or in the opposite direction. The two other holding parts 7, which are arranged away from the axis 11, are likewise arranged in such a way that they can be moved in the directions of the double arrow. These holding parts 7 too have holding areas 8 that can be moved up to the edge 4 of the wafer 2. The wafer 2 rests essentially by its edge 4 on the supporting areas 6 of the supporting parts 5. These supporting areas 6 are preferably designed as oblique planes that extend concentrically with respect to the wafer 2 resting on them and slope towards the centre 3 of the wafer 2.

The surface of the supporting areas 6 can comprise a material that affects the sliding behaviour of the wafers. Preferred materials of this kind are Teflon® or polytetrafluoroethylene (PTFE, DuPont); these offer a soft surface and low friction. Coating the supporting areas 6 with hard substances such as titanium nitride (TiN) or titanium carbonitride (TiCN) gives a hard and, specifically, low-abrasion surface for the supporting areas 6.

As a departure from the illustration in FIG. 7, the holding part 7 arranged on the axis 11 can be of flat design and comprise rearward-oriented holding areas 8. The holding part 7 thus formed need only be displaceable in the directions of the double arrow, thus allowing a simpler construction, excluding rotary motion.

Figure 8:
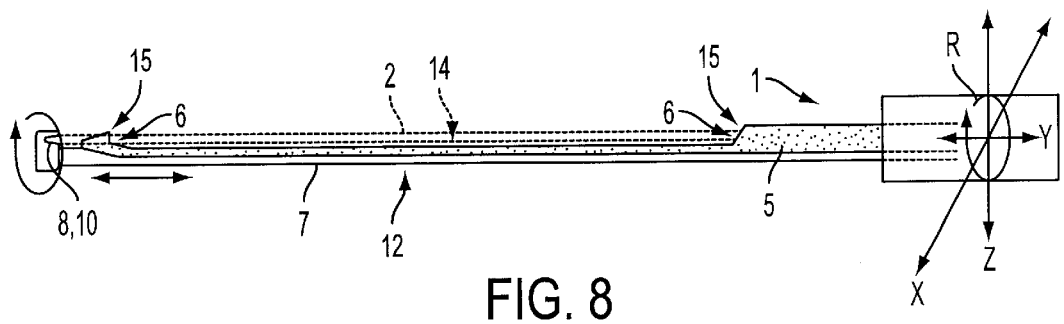
FIG. 8 shows a view through the apparatus in accordance with line of section A—A in FIG. 7.
Figure 9:
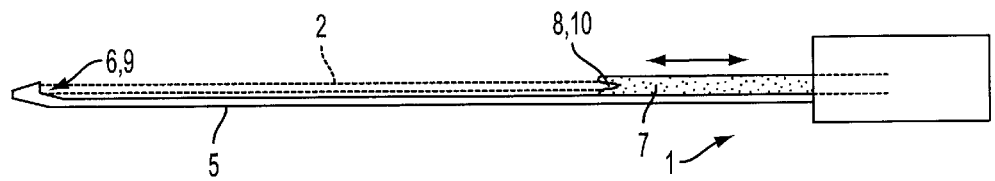
FIG. 9 shows a view through the apparatus in accordance with line of section B—B in FIG. 7.

FIGS. 8 and 9 show views through the apparatus 1 for handling individual wafers 2 in accordance with lines of section A—A and B—B in FIG. 7.

FIG. 8 shows a section through a supporting part 5. The supporting areas 6 designed as oblique planes, on which the wafer 2 rests essentially only in its edge region 4, are clearly visible here. The supporting part 5 is configured in such a way that the supporting areas 6 extend sufficiently far below the wafer 2 to ensure a gap 14 between the underside of the wafer 2 and the upper side of the supporting part 5. A vertical or even slightly backward-sloping rim 15 delimits the supporting areas 6, preferably likewise in a concentric manner, so that if there is a wafer lying completely on one side of the supporting areas 6, it cannot slip out of the supporting areas 6, hence ensuring that a gap 14 is always formed. Thus it is unimportant which side of the wafer 2 faces upwards—or away from the supporting parts 5—and which side faces downwards.

The apparatus 1 is preferably attached to an arm (not shown) and arranged in such a way that it can be rotated relative to a frame (not shown) in the direction of the arrow or in the opposite direction (rotation=R), and moved along all three spatial axes X, Y, Z. It has moreover proven advantageous for the arm to be secured relative to the frame at least by means of a joint (not shown). The combination of all these degrees of freedom allows any desired movement to be performed with a wafer that has been picked up.

To ensure that the wafer 2 is held in such a way that it cannot fall off the apparatus whatever movements are being performed that deviate from displacement of the wafer in an essentially horizontal direction, it is held at at least two holding points 10 by at least two holding parts 7 by means of the holding areas 8 of the latter. One possible design of such holding areas 8 is illustrated in FIG. 8. There, it can be seen that an essentially V-shaped slot has been machined into or left free in the head 13, giving two holding areas forming a "dovetail-like" configuration. This configuration of the mutually opposite holding areas 8 is also preferred in the variant (not shown) with a flat profile capable of translation (instead of the rotary rod 12).

FIG. 9 shows a section through an outer holding part 7 remote from the axis 11. Here too, the "dovetail-like" configuration of the holding areas 8 is clearly visible. These allow the wafer 2 to be held essentially at its edge 4 or in its edge region.

From the figures it is apparent that it is virtually impossible for the flat surfaces of an individual wafer 2 picked up and held by the apparatus 1 to be touched. This allows handling of the wafers with extremely little particle formation.

Methods for handling individual wafers 2 that are at least temporarily in an essentially horizontal position and that have a centre 3 and an edge 4, will now be described in detail by means of examples:

1. Picking Up a Wafer

There is a wafer at each storage level of a completely filled magazine used to store and transport wafers. The magazine may be standing alone on a support or may be in a transport box, the loading doors of which are already open.

An apparatus 1, which comprises at least one supporting part 5 with supporting areas 6 for supporting a wafer 2 in the edge region of the latter and at least one holding part 7 with holding areas 8 for gripping the edge 4 of this wafer, the supporting areas 6 comprising at least three supporting points 9 and the holding areas 8 comprising at least two holding points 10, is inserted essentially in a horizontal direction underneath the first wafer to be picked up, between this wafer and its nearest neighbour, a second wafer 2 arranged below it and likewise lying essentially horizontally in a stack. The overall height of the part of the apparatus 1 that is to be inserted will therefore expediently be chosen according to the size of the gap between each level of the wafer magazine, minus the thickness of a wafer and the necessary clearance above and below the apparatus required to ensure that none of the wafers is touched during insertion.

Once the apparatus 1 has been fully inserted, with the result that the supporting areas 6 are positioned essentially concentrically to the wafer 2 to be picked up, the apparatus 1, in particular the supporting parts 5 of the latter, is raised until the wafer 2 rests on the supporting points 9 of the supporting areas 6 and is no longer touching the rails of the magazine.

2. Transporting a Wafer

The apparatus 1 now moves out of the magazine with the wafer 2 picked up. Before moving out or preferably only while moving out, the holding parts 7 and hence also the holding areas 8 are moved relative to the wafer 2 and hence also relative to the supporting points 9 until the wafer 2 is held essentially at its edge 4. The holding areas 8 arranged in a "dovetail-like" manner with the holding points 10 hold the wafer in such a way that it is fixed in the apparatus in such a way that it is held in the apparatus 1 so as to be immovable by movements of the apparatus 1 during the handling of the wafer 2 or by any joint changes in position of the apparatus 1 with the wafer 2.

3. Deposition of a Wafer

Outside the wafer magazine, the wafer is put down again in an essentially horizontal position at any desired location, which may be both at a significantly higher or significantly lower level and to the side of the original position of the wafer in the magazine. The wafer 2 can, of course, also be deposited in its original position in a first magazine or in any desired position in a second magazine.

A wafer 2 is preferably deposited in a manner exactly the reverse of that for picking it up so that the holding parts 7 with the holding areas 8 are moved away from the edge 4 of the wafer 2 even as they are being inserted into a magazine in an essentially horizontal direction and the wafer 2 thus lies freely on the supporting points 9 of the supporting areas 6. As soon as the wafer has reached its deposition position, the apparatus 1 or supporting parts 5 are lowered with the wafer 2 until the latter rests on the bars or rails of the magazine and the apparatus is at a sufficient distance from the lower surface of the wafer. The apparatus is then retracted or moved out of the magazine.

It is likewise possible to deposit the wafer 2 in an essentially vertical position on a corresponding support. It is even possible to deposit an inverted wafer 2 on a film of liquid.

Moving the apparatus 1 carrying a wafer 2 in and out takes a relatively long time because of the relatively long path. Raising the apparatus to pick up a wafer and lowering the apparatus to deposit a wafer, on the other hand, take only a relatively short time because of the relatively short paths. Grasping or gripping a wafer also requires a relatively long time, on the one hand because of the longer paths and, on the other hand, because of the preferential use of sensors that allow the holding force to be controlled within desired limits. Moreover, an additional rotary motion to be carried out extends the time required before the wafer 2 is reliably held (cf. FIG. 8).

The present invention thus allows two main functions, namely picking up a wafer and grasping or gripping it to hold it reliably or releasing it, to be separated in space and time. Thus, because gripping and release can take place simultaneously with retraction or insertion of the apparatus 1 from or into a magazine, the process time for a removal cycle or a loading cycle is shortened—as described above—and this affects a significant cost factor when the number of wafers to be handled is large.

Further advantages of the apparatus according to the invention include the reliable holding of a wafer. This allows:

the wafer to be handled at high speed outside a magazine and this, in turn, signifies a time saving;

the wafer to be deposited in almost any desired position in space, which can mean the elimination of an additional "handling robot".

What is claimed is:

1. Apparatus (1) for handling individual wafers (2) that are at least temporarily in an essentially horizontal position and that have a centre (3) and an edge (4), the apparatus (1) comprising at least one supporting part (5) with supporting areas (6) for supporting a wafer (2) in the edge region of the latter and at least one holding part (7) with holding areas (8) for gripping the edge (4) of this wafer, the supporting areas (6) comprising at least three supporting points (9) and the holding areas (8) comprising at least two holding points (10), and the at least two holding points (10) being arranged such that they can be moved relative to the supporting points (9) and to grasp the wafer (2), relative to one another, and wherein at least one of these holding points (10) is arranged on a rotatable rod (12) designed, for reliable holding of the wafer, as a holding part (7), with this rotatable rod (12) extending coaxially with an axis (11) running through the centre (3) of the wafer (2) and essentially parallel to the surface of the wafer.

2. Apparatus according to claim 1, wherein the rotatable rod (12) comprises a head (13) with holding areas (8) that form a "dovetail-like" configuration.

3. Apparatus according to claim 1, wherein the holding areas (8) comprise at least three holding points (10), two of which are arranged on each side of the axis (11).

4. Apparatus according to claim 1, wherein the supporting areas (6) are designed as oblique planes.

5. Apparatus according to claim 1, wherein the supporting areas (6) comprise a material that affects the friction between the supporting part (5) and the wafer (2).

6. Method for handling individual wafers (2) that are at least temporarily in an essentially horizontal position and that have a centre (3) and an edge (4), with an apparatus (1) that comprises at least one supporting part (5) with supporting areas (6) for supporting a wafer (2) in the edge region of the latter and at least one holding part (7) with holding areas (8) for gripping the edge (4) of this wafer, the supporting areas (6) comprising at least three supporting points (9) and the holding areas (8) comprising at least two holding points (10), and the at least two holding points (10) being arranged in such a way that they can be moved relative to the supporting points (9) and, to grasp the wafer (2), relative to one another, and wherein the wafer (2) is raised by raising the supporting areas (6) and held by moving the holding areas (8) relative to the supporting areas (6) and moving at least two holding points (10) relative to one another, at least one of these holding points (10) being arranged on a rotatable rod (12) designed as a holding part (7) that extends coaxially with an axis (11) running through the centre (3) of the wafer (2) and essentially parallel to the surface of the wafer.

7. Method according to claim 6, further including the following steps:
- insertion of the apparatus (1) between a first wafer (2) and a second wafer (2) arranged below it and lying essentially horizontally in a stack;
- raising the supporting areas (6) until the first wafer rests on the supporting points (9) and is raised;
- moving the holding areas (8) relative to the supporting areas (6) until the first wafer is held at its edge (4) by means of the holding points (10); and
- retraction of the apparatus (1) from the stack of wafers.

8. Method according to claim 6, wherein the insertion of the apparatus (1) into a stack of vertically stacked, essentially horizontal wafers (2) is performed from one side.

9. Method according to claim 6, wherein the movement of the holding areas (8) relative to the supporting areas (6) is performed simultaneously and during the retraction of the apparatus (1) from the stack of wafers.

10. Method according to claim 6, wherein the first wafer (2) is moved at least in one of the four possible directions of motion (X, Y, Z, R).

11. Method according to claim 6, wherein the movement of the holding areas (8) relative to the supporting areas (6) is performed simultaneously and during the insertion of the apparatus (1) into a stack of wafers.

12. Method according to claim 6, wherein the first wafer (2) is deposited in a horizontal or vertical position.

* * * * *